United States Patent
Chiang et al.

(10) Patent No.: US 9,868,632 B2
(45) Date of Patent: Jan. 16, 2018

(54) MOLDED CAVITY PACKAGE WITH EMBEDDED CONDUCTIVE LAYER AND ENHANCED SEALING

(71) Applicant: Infineon Technologies AG, Neubiberg (DE)

(72) Inventors: Chau Fatt Chiang, Melaka (MY); Kok Yau Chua, Melaka (MY); Swee Kah Lee, Melaka (MY); Chee Yang Ng, Johor (MY); Horst Theuss, Wenzenbach (DE)

(73) Assignee: Infineon Technologies AG, Neubiberg, DE (US)

( * ) Notice: Subject to any disclaimer, the term of this patent is extended or adjusted under 35 U.S.C. 154(b) by 13 days.

(21) Appl. No.: 15/079,593

(22) Filed: Mar. 24, 2016

(65) Prior Publication Data

US 2017/0275159 A1    Sep. 28, 2017

(51) Int. Cl.
 *H01L 21/48*     (2006.01)
 *B81C 1/00*      (2006.01)
 *H01L 23/552*    (2006.01)
 *H01L 23/498*    (2006.01)
 *B81B 7/00*      (2006.01)

(52) U.S. Cl.
 CPC ........ *B81C 1/00333* (2013.01); *B81B 7/0064* (2013.01); *H01L 21/486* (2013.01); *H01L 21/4878* (2013.01); *H01L 23/498* (2013.01); *H01L 23/552* (2013.01); *B81C 2203/019* (2013.01)

(58) Field of Classification Search
 CPC .................................................... H01L 21/486
 See application file for complete search history.

(56) References Cited

U.S. PATENT DOCUMENTS

| | | |
|---|---|---|
| 6,303,986 B1 | 10/2001 | Shook |
| 6,661,084 B1 | 12/2003 | Peterson et al. |
| 6,674,159 B1 | 1/2004 | Peterson et al. |
| 6,781,231 B2 | 8/2004 | Minervini et al. |
| 7,432,586 B2 | 10/2008 | Zhao et al. |

(Continued)

OTHER PUBLICATIONS

Evans Jr., Daniel D., "Advances in MEMS Packaging", Solid State Technology, Accessed Dec. 22, 2015, pp. 1-7.

(Continued)

*Primary Examiner* — Fernando L Toledo
*Assistant Examiner* — Valerie N Newton
(74) *Attorney, Agent, or Firm* — Murphy, Bilak & Homiller, PLLC

(57) ABSTRACT

A base plate with a first side having an elevated portion, a recessed portion laterally surrounding the elevated portion, and a vertical face extending from the recessed portion to the elevated portion is provided. At least a part of the vertical face is covered with a metal layer. A mold compound structure is formed on the first side with the metal layer disposed between the first side and the mold compound structure such that the mold compound structure includes an elevated portion laterally surrounding a recessed portion, and opposing edge faces that vertically extend from the recessed portion to the elevated portion. At least a part of the base plate is subsequently removed such that the recessed portion of the mold compound structure is uncovered from the base plate and such that the metal layer remains on at least one uncovered section of the mold compound structure.

14 Claims, 18 Drawing Sheets

(56) References Cited

U.S. PATENT DOCUMENTS

| | | |
|---|---|---|
| 7,811,427 B2 | 10/2010 | Cohen et al. |
| 7,972,901 B2 | 7/2011 | Jaynes et al. |
| 9,002,038 B2 | 4/2015 | Ochs et al. |
| 9,142,470 B2 | 9/2015 | Yang et al. |
| 2007/0071268 A1 | 3/2007 | Harney et al. |

OTHER PUBLICATIONS

Shumway, Russell, "High Volume Assembly & Test Solutions to Meet the Rapidly Growing MEMS Market", Amkor Technology, May 23, 2012, pp. 1-21.

Zinck, Christophe, "Mems & Sensors Packaging Evolution", ASE Group, Sep. 26, 2013, pp. 1-28.

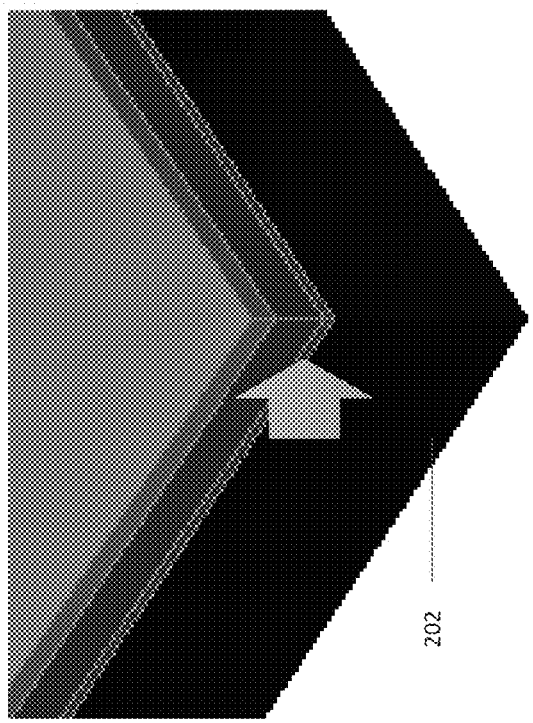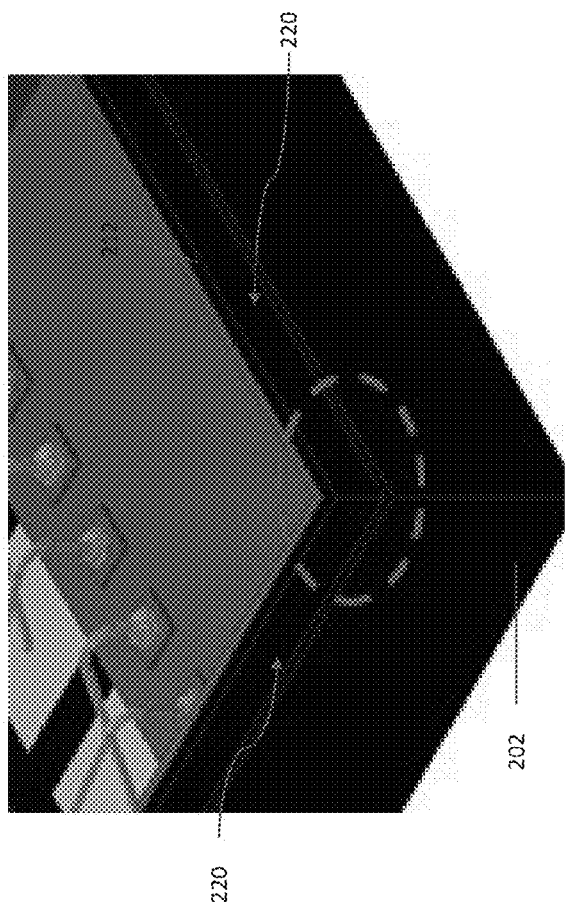
FIG. 15A　FIG. 15B
FIGURE 15

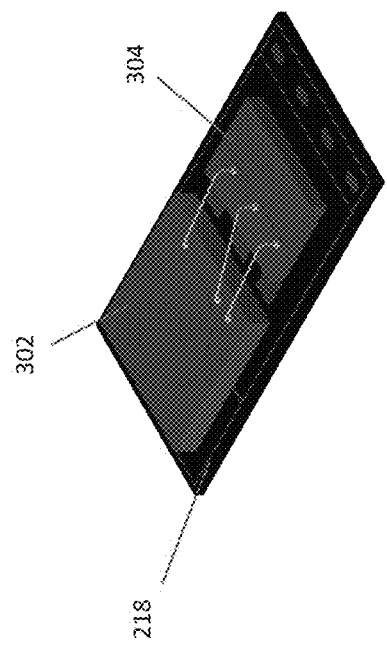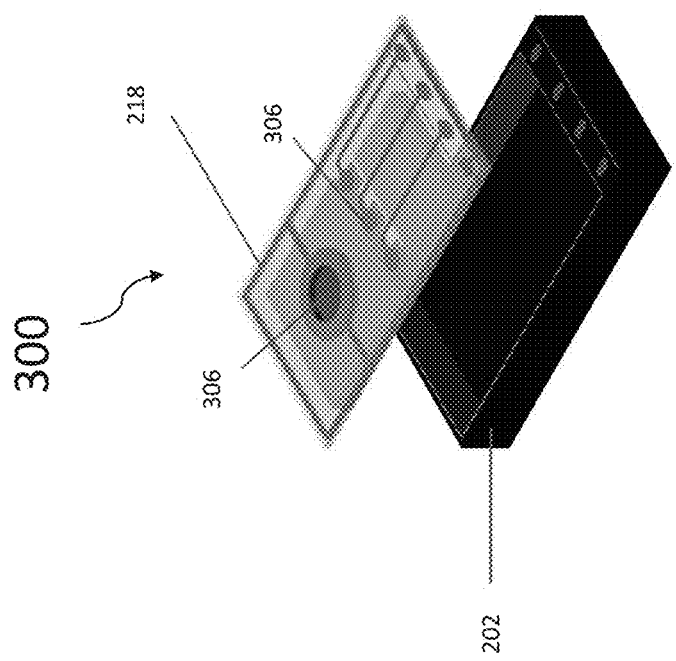
FIG. 17A
FIG. 17B
FIGURE 17

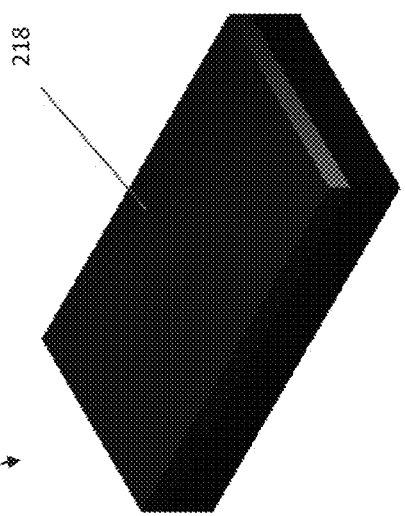
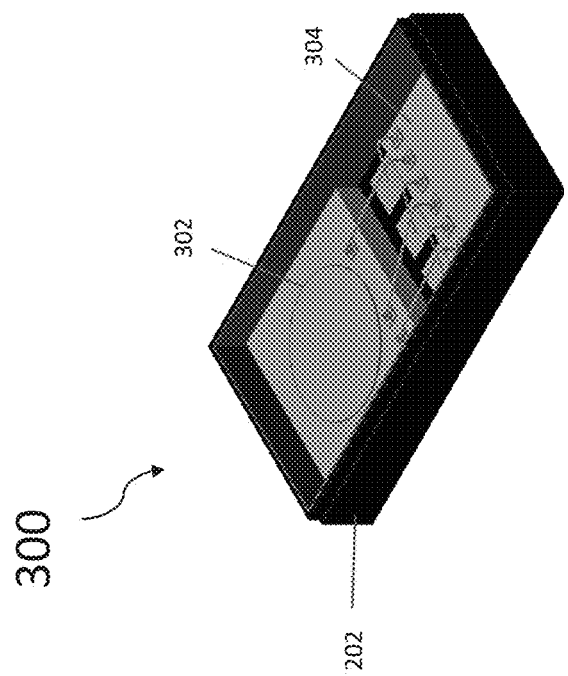
FIG. 18A
FIG. 18B
FIGURE 18

US 9,868,632 B2

MOLDED CAVITY PACKAGE WITH EMBEDDED CONDUCTIVE LAYER AND ENHANCED SEALING

TECHNICAL FIELD

The instant application relates to semiconductor packaging, and more particularly relates to molded cavity semiconductor packages.

BACKGROUND

Semiconductor packages are used in many applications to house and protect a variety of integrated circuits, such as controllers, ASIC devices, sensors, etc. One particular kind of semiconductor package is a molded cavity package. Typically, the package includes electrically conductive leads for connecting the integrated circuits to an external device. The leads may be bent or flat. An electrically insulating molding compound that is formed around the leads provides the cavity of the package. The cavity provides a three dimensional interior volume that accommodates one or more integrated circuits. Once the integrated circuit is placed in the cavity and connected to the leads, the cavity is sealed by a lid.

A semiconductor package should protect the integrated circuit from potentially damaging environmental conditions, such as extreme temperature variations, moisture, dust particles, etc., while simultaneously providing an electrical interface between the integrated circuit and the parent circuit, e.g., PCB (printed circuit board). Packaging of sensor devices, such as MEMs (micro-electromechanical systems) sensor devices presents unique challenges because these devices are typically used to measure external environmental parameters such as temperature, pressure, sound, composition of atmosphere, etc. The sensor elements typically require at least partial exposure to the exterior environment so that the environmental parameter can be measured. Meanwhile, the rest of the circuitry and electrical connections associated with the MEMs device should ideally be protected from the exterior environment.

One area of focus in semiconductor packaging relates to EMI (electro-magnetic-interference) protection. EMI refers to external and unpredictable RF signals that may be present in the environment in which the integrated circuit is operating. These RF signals can potentially distort the electronic signaling of the integrated circuit and can cause complete failure. One technique for protecting the integrated circuit from EMI involves electromagnetic shielding in which a conductive shield structure that is maintained at a constant potential (e.g., GND) is interposed between the integrated circuit and the exterior environment. In particular, the lid of the package may be formed from an electrical conductor and provide an EMI shield. However, there are several drawbacks to this technique. First, the inclusion of metal in the lid adds cost and complexity to the package manufacturing process. In particular, batch processing of the lid attachment process is typically not possible, as the lid must be precisely placed and an adhesive must be used. In some cases, the seal between the lid and the package is compromised and the package must be discarded. Moreover, these metal lids are not easily shrunk and therefore limit the scalability of the device.

Another design consideration in semiconductor packaging relates to the orientation of the package, relative to the article to which the package is connected (e.g., a PCB). Some applications require electrical connections to be made on the bottom side of the package, opposite from the lid. Other applications prefer the top side of the package to face and electrically connect with the PCB. For example, in MEMs applications, some users may prefer a port-facing-down configuration whereas other users prefer a port-facing-up configuration. The semiconductor package can be individually tailored to meet these configurations, but this lowers production volume and increases expense. Alternatively, the package can have a universal design. In that case, the package requires electrical connections in the vertical direction, i.e., from the top to the bottom. This adds cost and complexity to the design.

SUMMARY

A method of forming a semiconductor package is disclosed. According to an embodiment, the method includes providing a base plate with a first side having an elevated portion, a recessed portion laterally surrounding the elevated portion, and a vertical face extending from the recessed portion to the elevated portion. At least a part of the vertical face is covered with a metal layer. A mold compound structure is formed on the first side of the base plate with the metal layer disposed between the first side and the mold compound structure such that the mold compound structure includes an elevated portion laterally surrounding a recessed portion, and opposing edge faces that vertically extend from the recessed portion of the mold compound structure to the elevated portion of the mold compound structure. At least a part of the base plate is subsequently removed such that the recessed portion of the mold compound structure is uncovered from the base plate and such that the metal layer remains on at least one uncovered section of the mold compound structure.

A semiconductor package is disclosed. According to an embodiment, the semiconductor package includes an electrically insulating molded cavity section having a floor and outer sidewalls vertically extending away from the floor, the floor and the outer sidewalls defining an interior cavity of the semiconductor package. A metal layer is adhered to at least a portion of the outer sidewalls. Electrically conductive leads are exposed at an outer side of the floor, the outer side being opposite the interior cavity. The package further includes a lid that is dimensioned to be placed on top edges of the outer sidewalls so as to cover the interior cavity.

A packaged semiconductor device is disclosed. According to an embodiment, the packaged semiconductor device includes a semiconductor package. The semiconductor package includes a molded cavity section formed from an electrical insulator and including a floor and outer sidewalls vertically extending away from the floor, the floor and outer sidewalls defining an interior cavity. The semiconductor package further includes one or more electrically conductive leads exposed from an outer side of the molded cavity section and providing electrical access to the interior cavity, a metal layer adhered to at least a portion of the outer sidewalls, and a lid disposed on top edges of the molded cavity section so as to form a seal around an outer perimeter of the molded cavity section. The packaged semiconductor device further includes a semiconductor device disposed in the interior cavity and connected to the one or more electrically conductive leads.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 5A and 5B, depicts a selected method step for forming a semiconductor package, according to two different embodiments.

FIG. 15, which includes FIGS. 15A and 15B, illustrates a close up view of a top edge of a semiconductor package, according to an embodiment.

FIG. 17, which includes FIGS. 17A and 17B, illustrates a semiconductor package with a semiconductor device mounted to the package lid, according to an embodiment.

FIG. 18, which includes FIGS. 18A and 18B, illustrates a semiconductor package with a semiconductor device mounted in the base portion of the package, according to an embodiment.

DETAILED DESCRIPTION

Embodiments disclosed herein include a method of forming a semiconductor package. According to the method, a mold base plate is provided with three dimensional features along one side of the mold base plate. That is, one side of the mold base plate is non-planar. Subsequently, a metal layer is formed on the non-planar face of the mold base plate. Subsequently, an electrically insulating molding compound (e.g., a thermoset plastic) is formed on the non-planar side of the base plate. This may be done by an encapsulation process, for example. Accordingly, the molding compound conforms to the three dimensional features of the mold base plate, with the metal layer interposed between the mold base plate and the mold compound. In this way, the features of the mold base plate provide an inverse geometry of the molded package structure. Eventually, the mold base plate is removed and the hardened molding compound remains. The metal layer also remains adhered to the vertical sidewalls of the mold compound. The process provides a simple, low-cost way to embed metal conductors within the package, as the metal can be reliably formed on the mold base plate by a plating process. Moreover, the embedded metal can extend in the vertical direction of the package, and can be patterned into a number of different advantageous shapes.

Embodiments disclosed herein include a semiconductor package. The semiconductor package includes many advantageous features that can be achieved using the methods described herein. For example, the semiconductor package may include a metal layer completely coating the vertical sidewalls of the molded cavity portion. This metal layer can be electrically grounded (e.g., by package leads) so as to provide an EMI shield that is embedded in the sidewalls of the package. In addition, the package may include metal pads that are formed on an elevated portion of the mold compound, i.e., a region that is vertically spaced apart from the floor of the molded cavity portion. These metal pads can be patterned in an elongated shape (e.g., an oval). The package further includes a lid with corresponding pads that are elongated in a different direction. The lid can therefore be easily aligned with the package using the pads from each structure.

Figure 1:
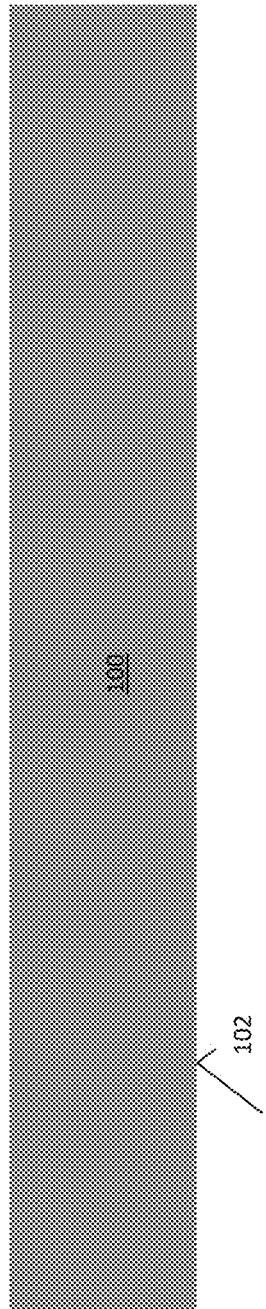
FIG. 1, FIG. 2, FIG. 3, and FIG. 4 each depict selected method steps for forming a semiconductor package, according to an embodiment.

Referring to FIG. 1, a mold base plate 100 with a planar first side 102 is provided. The mold base plate 100 can consist of any material that can be etched, coined, stamped or grinded, and can withstand the temperatures associated with a molding process. For example, the mold base plate 100 can be a metal. According to an embodiment, the mold base plate 100 is a sheet layer of stainless steel (e.g., SPCC).

Figure 2:
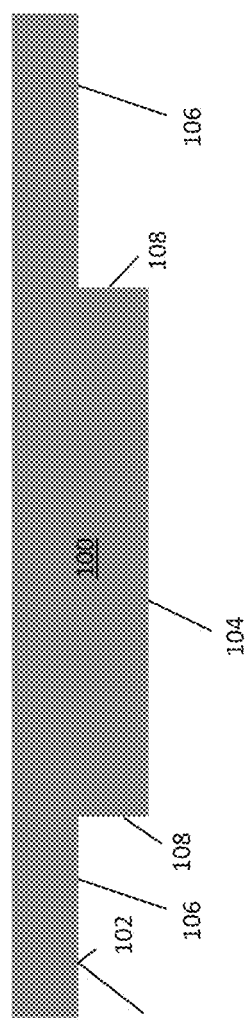

Referring to FIG. 2, the mold base plate 100 has been processed to form a three dimensional shape in the first side 102. As a result, the first side 102 has a non-planar topography. According to one embodiment, the first side 102 of the mold base plate 100 is formed to include an elevated portion 104, a recessed portion 106 laterally surrounding the elevated portion 104, and a vertical face 108 extending from the recessed portion 106 to the elevated portion 104. The elevated portion 104 vertically extends away from the first side 102. Vertically extends refers to the fact that the vertical face 108 forms an angle with the first side 102. The vertical face 108 may be, but is not necessarily, orthogonal to the elevated portion 104 and the recessed portion 106. The vertical face 108 may form a closed loop in the mold base plate 100 from a plan-view perspective of the first side 102. For example, the elevated portion 104 may be formed in the shape of a square or rectangle from a plan-view perspective of the first side 102, with the vertical face 108 providing the perimeter of the square or rectangle.

The mold base plate 102 can be formed manner depicted in FIG. 2 by any additive or subtractive process. For example, a mold base plate 100 depicted in FIG. 1 can be provided and subsequently formed into the mold base plate 100 depicted in FIG. 2 using a stamping process. Alternatively, a grinding or etching process may be used.

Figure 3:
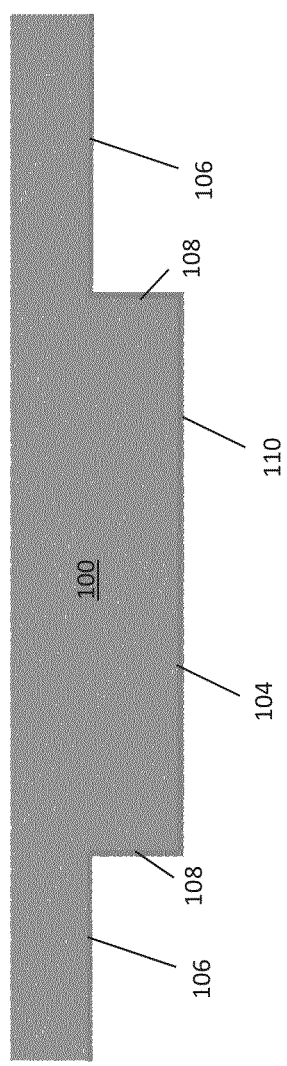

Referring to FIG. 3, a metal layer 110 is formed on the first side 102 of the mold base plate 100. The metal layer 110 may be any electrical conductor, such as copper, aluminum, gold and suitable alloys thereof. The metal layer 110 can be formed according to any of a variety of techniques, such as chemical or laser metal deposition or electroplating. The metal layer 110 is formed at least on the vertical face 108 of the first side 102, and may cover the entire vertical face 108. If, for instance, the metal layer 110 is formed using a deposition technique, all of the exposed first side 102 of the mold base plate 100 including the elevated portion 104, the recessed portion 106, and the vertical face 108 can be covered by a continuous section of the metal layer 110.

Figure 4:
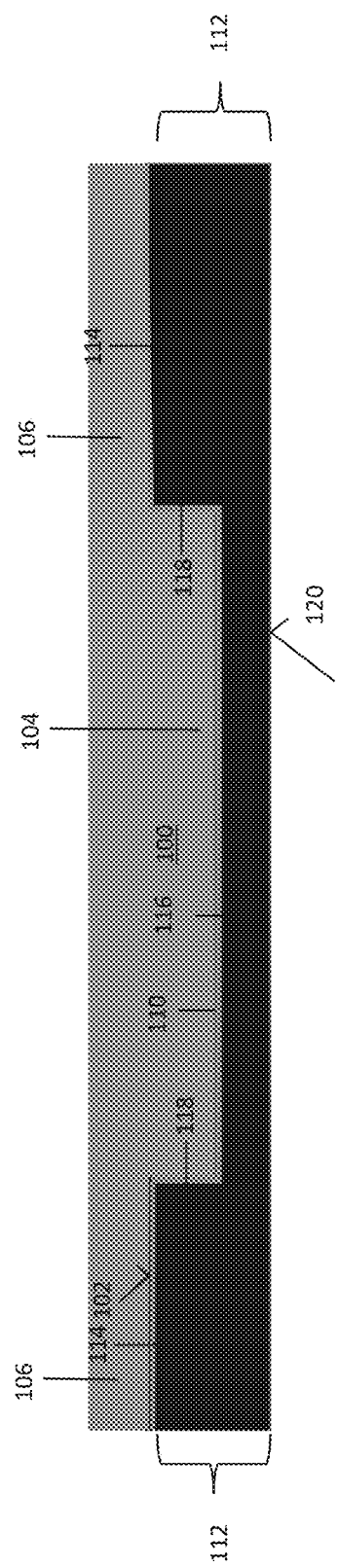

Referring to FIG. 4, a first mold compound section 112 is formed on the first side 102 of the mold base plate 100. The first mold compound section 112 is formed over the metal layer 110 such that the metal layer 110 is disposed between the first side 102 of the mold base plate 100 and the first mold compound section 112. The first mold compound section 112 conforms to the shape of the first side 102 of the mold base plate 100. For example, in an embodiment in which the first side 102 of the mold base plate 100 includes the elevated portion 104, the recessed portion 106 and the vertical face 108, the first mold compound section 112 has an inverse geometry, with an elevated portion 114 of the first mold compound section 112 filling the recessed portion 106 of the mold base plate 100, a recessed portion 116 of the first mold compound section 112 covering the elevated portion 104 of the mold base plate 100, and opposing edge faces 118 that vertically extend from the recessed portion 116 of the first mold compound section 112 to the elevated portion 114 of the first mold compound section 112 being opposite the vertical face 108 of the first mold compound section 112.

Any of a variety of molding techniques can be used to form the first mold compound section 112. For example, the first mold compound section 112 can be formed by mold sheet laminate (cladding) process whereby the mold base plate 100 is placed in or forms part of the mold cavity. The material of the first mold compound section 112 can be any electrical insulator that is compatible with a molding process, such as a plastic material and more particularly a thermoset plastic.

Figure 5:
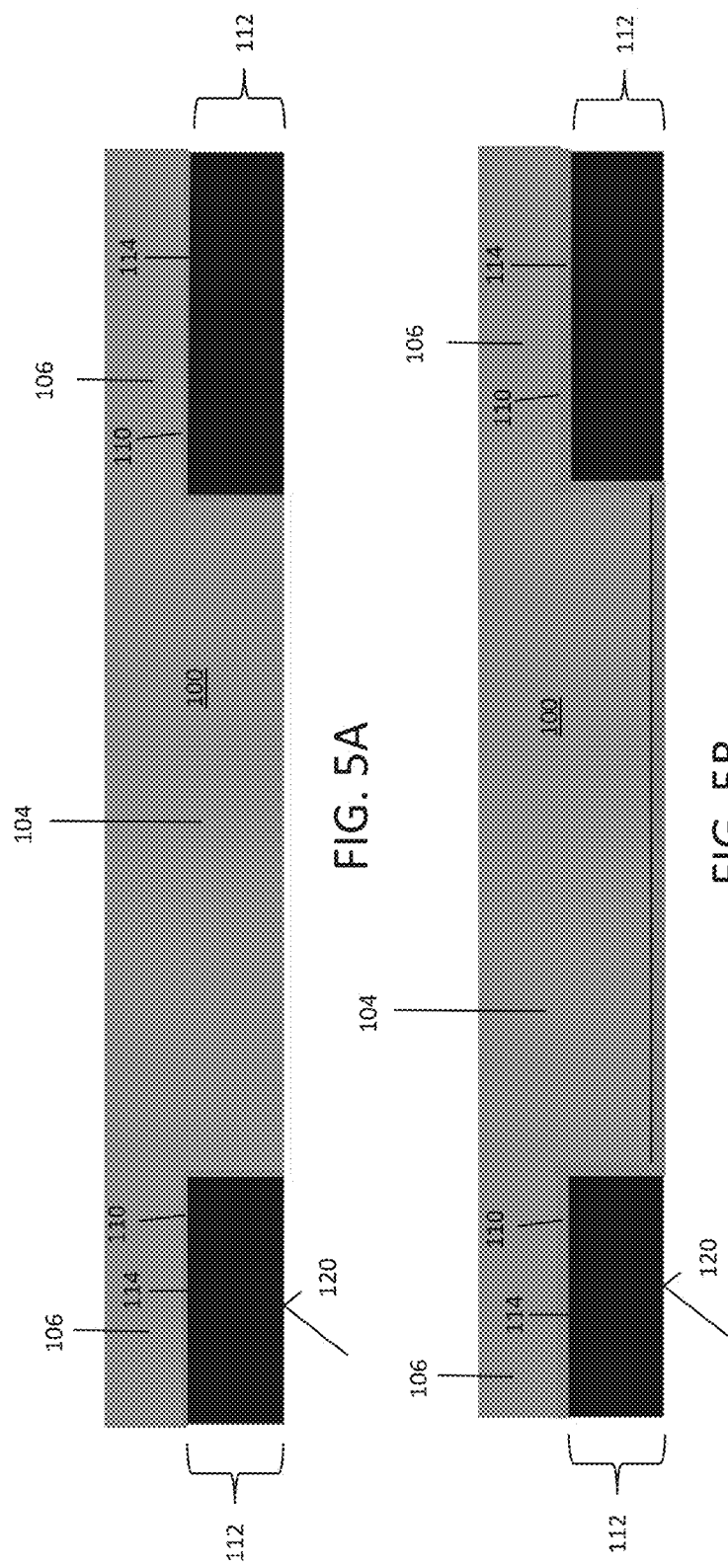
FIG. 5, which includes

Referring to FIG. 5, the first mold compound section 112 is thinned at a rear face 120 that faces away from the first side 102 of the mold base plate 100. This can be done by any of a variety of planarizing techniques, such as polishing or grinding.

FIG. 5A depicts an embodiment in which the thinning process removes both the first mold compound section 112 and the portion of the metal layer 110 that covers the elevated portion 104 of the mold base plate 100. As a result, the elevated portion 104 of the mold base plate 100 is completely exposed. The thinning process shortly after the elevated portion 104 of the mold base plate 100 becomes exposed such that the elevated portion 104 of the first mold compound section 112 remains substantially intact.

FIG. 5B depicts an embodiment in which the thinning process removes only the first mold compound section 112 and is stopped before the portion of the metal layer 110 that covers the elevated portion 104 of the mold base plate 100. As a result, a lower side of the package device includes the rear face 120 of the first mold compound section 112 and the metal layer 110.) by a masked etching technique. In the embodiment of FIG. 5B, the metal layer 110 is substantially thicker than the embodiment of FIG. 5A. For example, the metal layer 110 may be a thickness of approximately 20-25 μm in the embodiment of FIG. 5A whereas the metal layer 110 may have a thickness of approximately 50-60 μm in the embodiment of FIG. 5B. The thicker metal layer 110 provides a sufficient margin to perform the thinning process described herein and stop the thinning process without risk of completely removing some or all of the portion of the metal layer 110 that covers the elevated portion 104 of the mold base plate 100.

Figure 6:
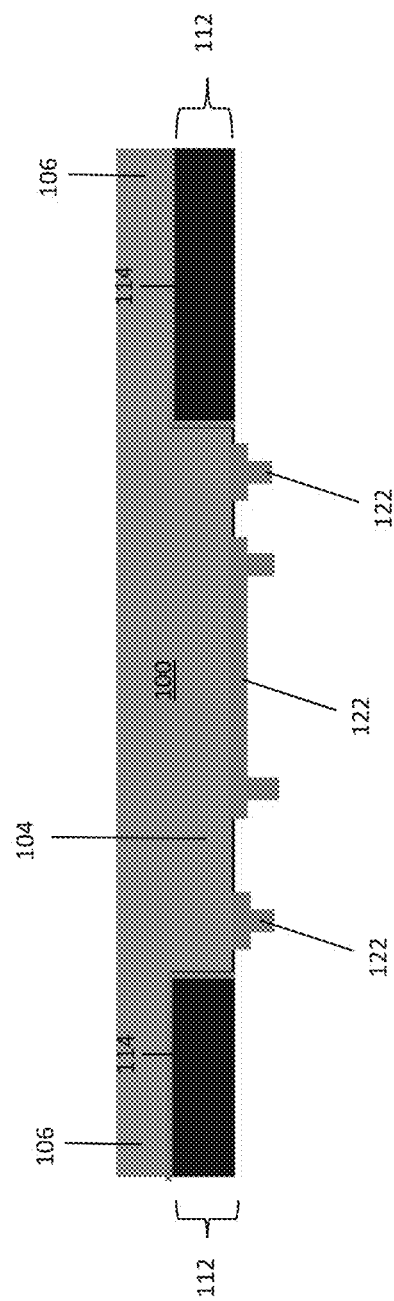
FIG. 6, FIG. 7, FIG. 8, FIG. 9, FIG. 10, FIG. 11 and FIG. 12 each depict selected method steps for forming a semiconductor package, according to an embodiment.

Referring to FIG. 6, conductive structures 122 are formed on the exposed portion of the mold base plate 100. The conductive structures 122 can be formed by deposition, patterning, etc. For example, the conductive structures 122 can be formed by depositing a metal on the exposed elevated portion 104 of the mold base plate 100 in the case that the process described with reference to FIG. 5A is used. Alternatively, the conductive structures 122 can be formed patterning the metal layer 110 that covers the elevated portion of the mold base plate 100 in the case that the process described with reference to FIG. 5B is used.

Figure 7:
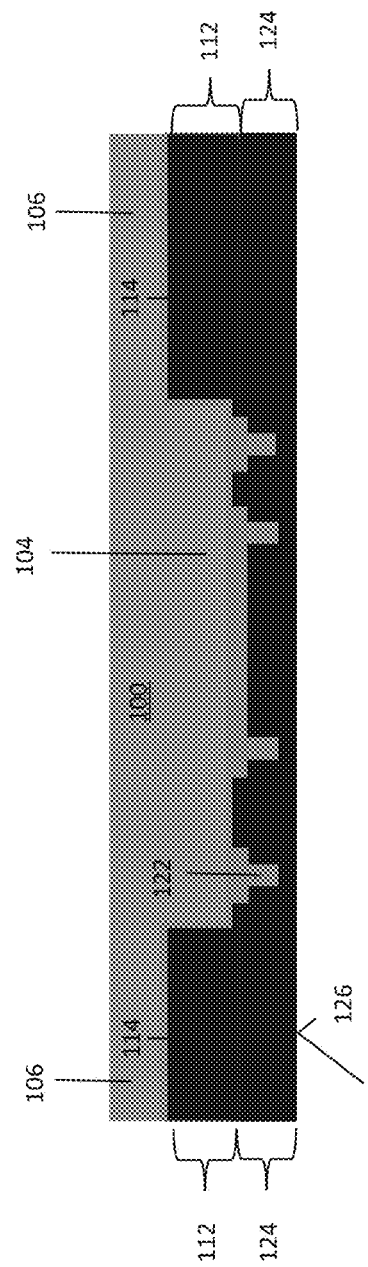

Referring to FIG. 7, a second molding process is performed. The second molding process may be substantially similar or identical to the molding process described with reference to FIG. 4. A second mold compound section 124 is formed at the rear face 120 of the first mold compound section 112, e.g., by injection molding. As a result, the second mold compound section 124 and the first mold compound section 112 form a continuous mold compound structure that covers the first side 102 of the mold base plate 100 and electrically insulates the conductive structures 122 from one another.

Figure 8:
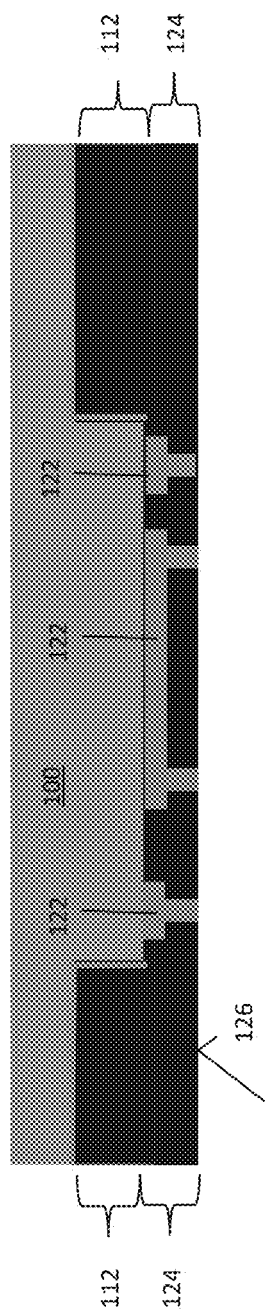

Referring to FIG. 8, a second thinning process is applied to a rear side 126 of the second mold compound section 124. The second thinning process may be substantially similar or identical to the thinning process described with reference to FIG. 5. The rear side 126 of the second mold compound section 124 can be thinned until the conductive structures 122 become exposed from the mold compound. The thinning process is stopped at or close to this time so as to not remove any more of the second mold compound section 124 than is necessary to expose the conductive structures 122.

Figure 9:
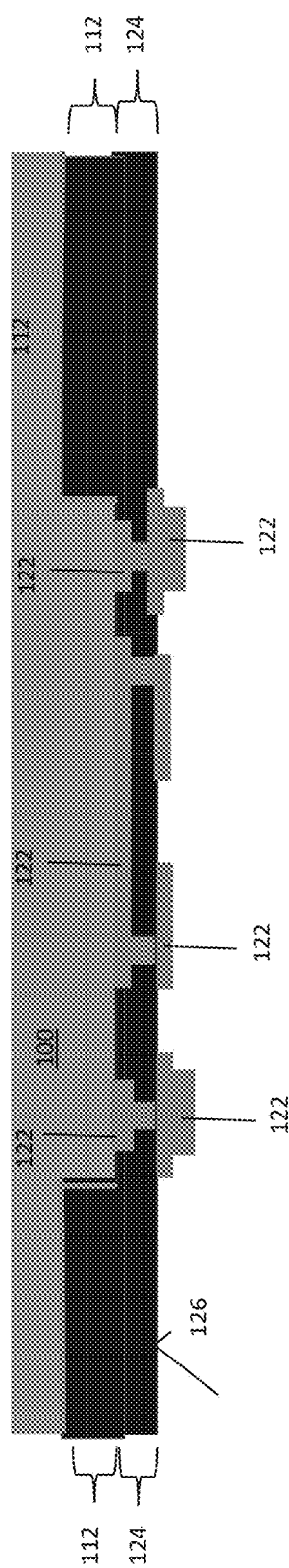
Figure 10:
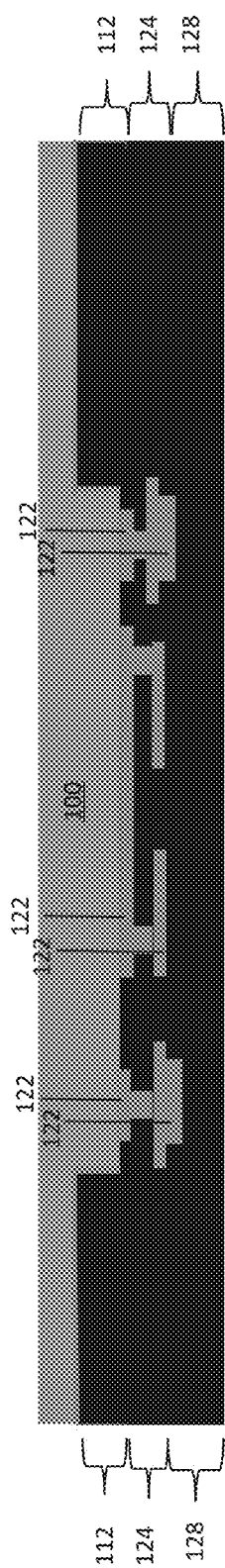
Figure 11:
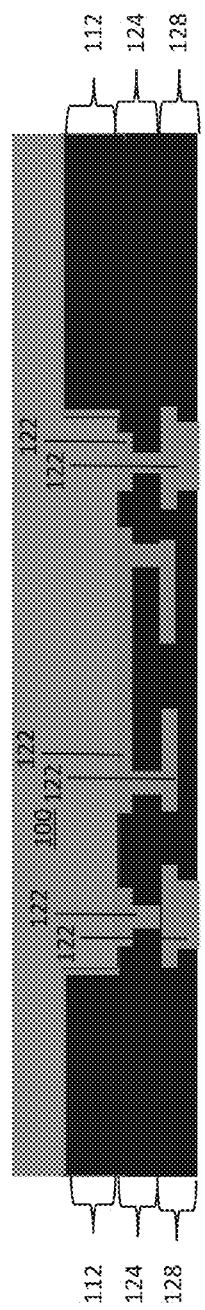

FIGS. 9-11 depict further optional processing steps that may be carried out to form another layer of the conductive structures 122 in the base section of the package. Referring to FIG. 9, a second set of the conductive structures 122 that are substantially similar to the conductive structures 122 described with reference to FIG. 6 are formed. The second set of the conductive structures 122 are formed at the rear side 126 of the second mold compound section 124 and may be connected to the conductive structures 122 that are embedded within the second mold compound section 124. The second set of the conductive structures 122 may be formed in a similar or identical manner as described with reference to FIG. 6.

FIG. 10 depicts a step of forming a third mold compound section 128. The third mold compound section 128 may be formed in a substantially similar or identical manner as the first and second mold compound sections 112, 124 as previously discussed.

FIG. 11 depicts a step of thinning the third mold compound section 128. This may be done in a substantially similar or identical manner as the thinning of the first and second mold compound sections 112, 124 as previously discussed. As a result, the conductive structures 122 are exposed from the third mold compound section 128 and are electrically accessible.

Figure 12:
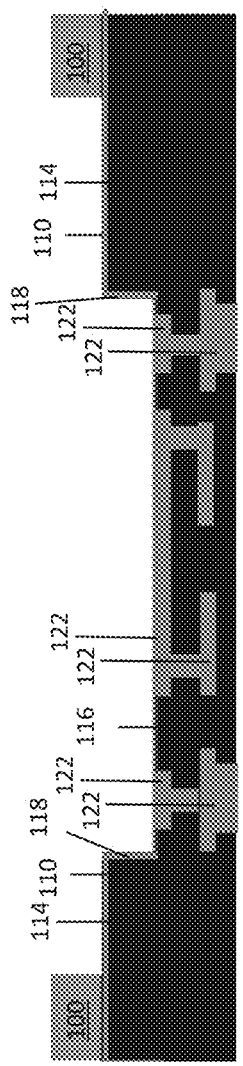

Referring to FIG. 12, the mold base plate 100 has been removed. The mold base plate 100 can be removed by chemical dissolution, for example. In the depicted embodiment, the mold base plate 100 has been partially removed. Specifically, a section of the mold base plate 100 that includes the elevated portion 104 has been removed, while an outer section remains intact. As a result, the recessed portion 106 of the mold compound structure is uncovered from the base plate. The mold base plate 100 is removed in such a way that leaves the metal layer 110 intact. As a result, the metal layer 110 remains on the uncovered sections of the mold compound structure. That is, after the mold base plate 100 is removed, the mold compound structure remains intact with the metal layer 110 lining the surfaces of the mold compound structure. Specifically, the opposing edge faces 118 of the mold compound structure are lined by the metal layer 110.

Advantageously, the process steps described with reference to FIGS. 1-12 enable the formation a high number of the semiconductor packages at low cost. The mold base plate 100 geometry can be repeated a number of times in a unit cell design such that a high number of the semiconductor packages with the mold compound structure and conductive metallization 210 described above can be formed simultaneously. That is, each of the process steps described above, e.g., stamping, cladding, encapsulation, etc., can be carried out in a batch processing technique.

Figure 13:
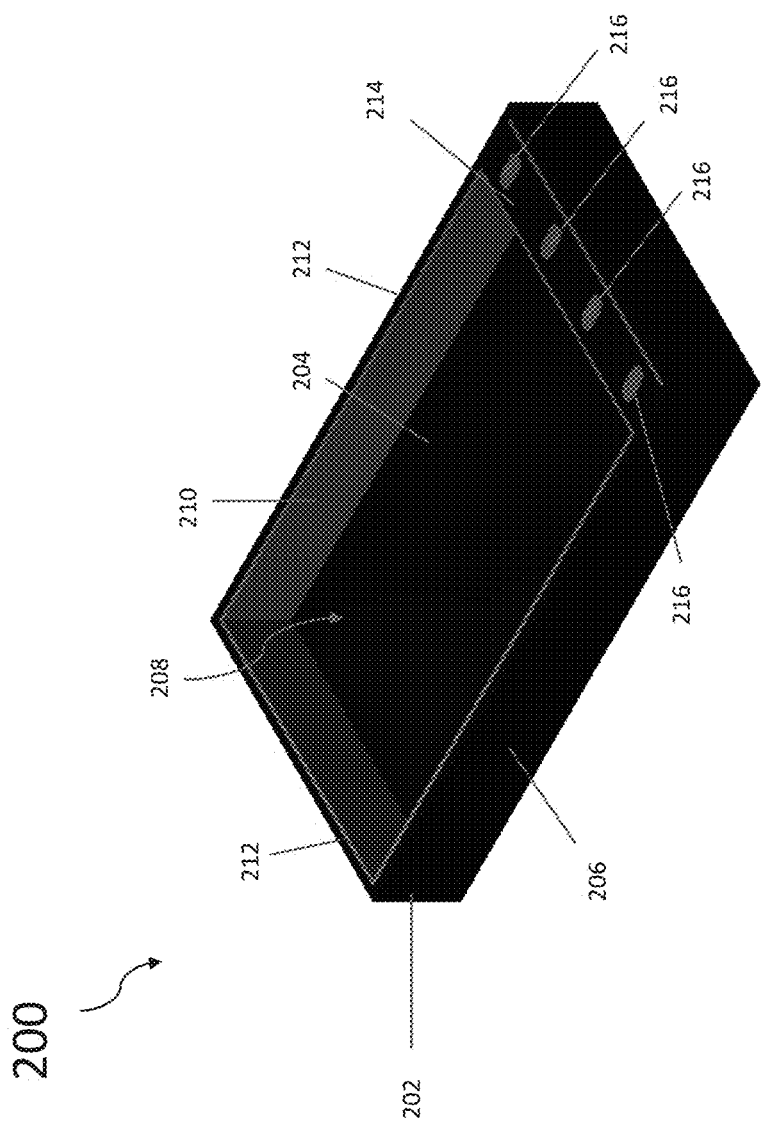
FIG. 13 illustrates a base section of a semiconductor package, according to an embodiment.

Referring to FIG. 13, an isometric view a semiconductor package 200 is depicted, according to an embodiment. The semiconductor package 200 includes a molded cavity section 202. The molded cavity section 202 includes a floor 204 and outer sidewalls 206 vertically extending away from the floor 204. The floor 204 and the outer sidewalls 206 define an interior cavity 208 of the semiconductor package in which one or more semiconductor chips can be placed in. That is, the molded cavity section 202 defines an interior volume of the package cavity. An electrically conductive metallization 210 extends along the outer sidewalls 206 and faces the interior cavity 208.

The molded cavity section 202 can be formed according to the process steps described with reference to FIGS. 1-12. More particularly, the outer sidewalls 206 can correspond to the elevated portion 104 of the mold compound structure and the floor 204 can correspond to the recessed portion 106 of the mold compound structure. Further, the conductive metallization 210 can correspond to the metal layer 110 that is formed along the opposing edge faces 118 of the mold compound structure.

The molded cavity section 202 further includes one or more electrically conductive leads (not visible in FIG. 13) that are exposed at an outer side of the floor 204. The cross-sectional representation of FIG. 12 can be corresponded to FIG. 13, with the conductive structures 122 providing the electrically conductive leads of the semiconductor package 200 and the rear side of the mold compound structure corresponding to the outer side of the floor 204.

The conductive metallization 210 can be used to provide an EMI shield that surrounds the interior cavity 208 and mitigates electromagnetic interference. According to an embodiment, the outer sidewalls 206 are completely lined with the conductive metallization 210. That is, the conductive metallization 210 completely extends from the floor 204 to the top edges 212 of the outer sidewalls 206. Moreover, the conductive metallization 210 forms a complete ring around the interior cavity 208. The conductive metallization 210 can be electrically connected to one of the package leads (e.g., a ground lead) so as to maintain the conductive metallization 210 at a desired potential (e.g., GND).

At one end of the package, there is a relatively thick vertical section 214 of molding compound. This geometry can be obtained by appropriate dimensioning of the mold base plate 100 in the process sequence previously discussed. The relatively thick vertical section 214 of molding compound corresponds to the elevated portion 104 of the mold compound structure previously discussed. As previously explained, the process can be carried out such that this elevated portion 104 includes a metal layer 110. The embodiment of FIG. 13 shows one possible configuration of the metal layer 110 after further processing steps. In this embodiment, the continuous metal layer 110 that was formed on the elevated portion 114 of the mold compound structure has been patterned. This step can be performed after the mold base plate 100 has been removed as shown in FIG. 12. According to an embodiment, a selective etching process is used to pattern the continuous metal layer 110 that is disposed on the thick vertical section 214 of molding compound. As a result, the thick vertical section 214 of molding compound includes isolated base portion pads 216. These base portion pads 216 can be connected or configured in many different ways. For example, the base portion pads 216 can be connected to the package leads so as to provide interior package terminals. This connection can be effectuated using the conductive metallization 210 extending along the outer sidewalls 206 or by forming another vertical layer of metal according to the techniques described herein. In addition, or in the alternative, the base portion pads 216 can be used as alignment features that assist with the lid assembly process. This will be described in further detail with reference to FIGS. 14-16.

Figure 14:
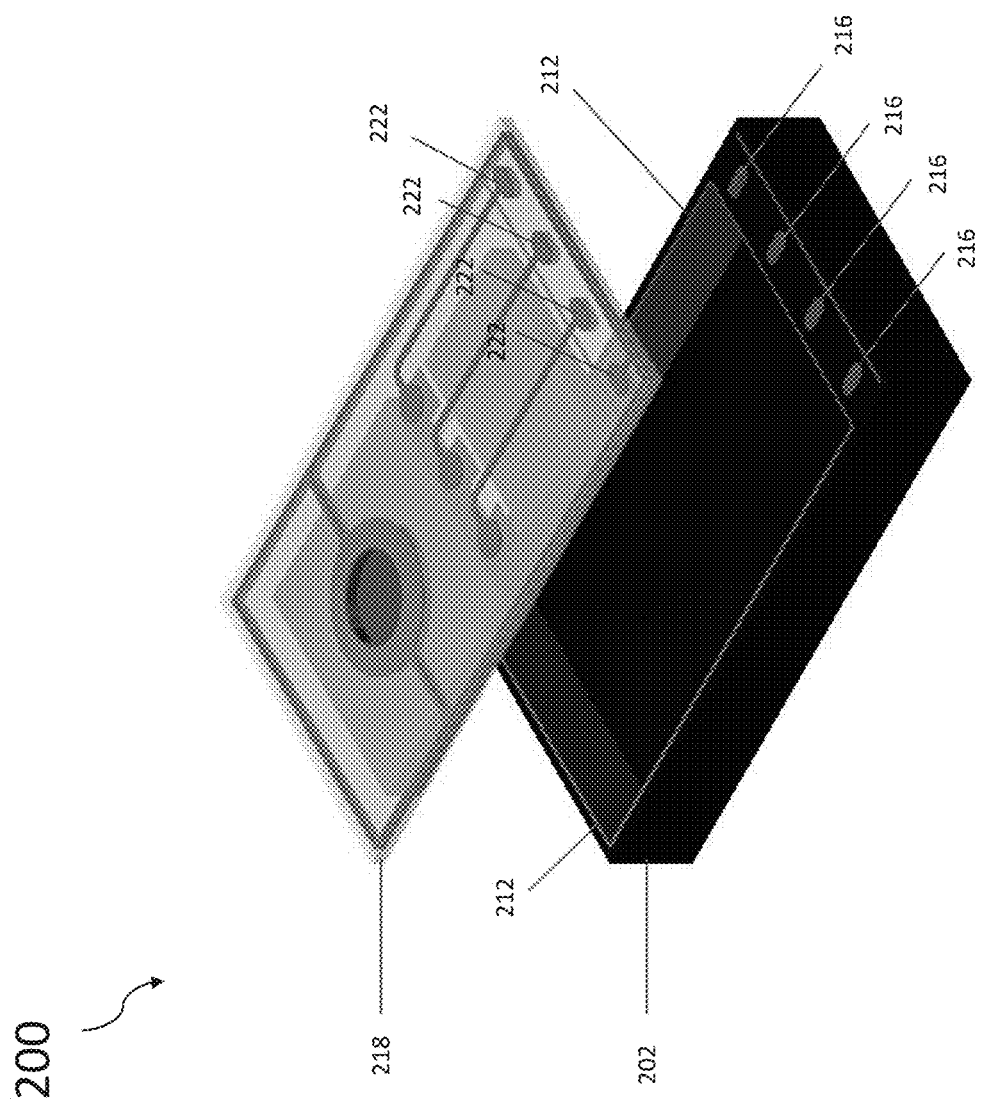
FIG. 14 illustrates a base section of a semiconductor package and a corresponding lid, according to an embodiment.

Referring to FIG. 14, a lid 218 for the semiconductor package 200 is depicted, according to an embodiment. The lid 218 is dimensioned to be placed on top edges 212 of the outer sidewalls 206 so as to cover the interior cavity 208. For example, the area of the lid 218 can be the same as of substantially close to the area of the outer perimeter of the outer sidewalls 206 so that the lid 218 can be placed over the outer sidewalls 206 and remain securely affixed thereafter.

Referring to FIG. 15, a close up view of the corner of the semiconductor package 200 is shown where the lid 218 interfaces with the molded cavity section 202. FIG. 15A depicts the molded cavity section 202 without the lid 218. FIG. 15B depicts a transparency of the lid 218 when the lid 218 is securely attached to the molded cavity section 202. In this embodiment, the outer sidewalls 206 of the molded cavity section 202 include grooves 220. The grooves 220 may be configured as a step-shaped transition in which a thicker portion of the outer sidewalls 206 transitions to a thinner portion of the outer sidewalls 206, wherein the thinner portion is disposed at the top edges 212 of the outer sidewalls 206. Other geometries are possible. For example, the grooves 220 can have features that are configured to interlock with a corresponding feature (e.g., protrusion) in the lid 218. The lid 218 is dimensioned to fit securely within the grooves 220. That is, when the lid 218 is placed on the molded cavity section 202 as depicted in FIG. 15B, the lid 218 rests on the grooves 220. An adhesive (i.e., glue) may be applied in the grooves 220 prior to attaching the lid 218. According to an embodiment, a thickness of the grooves 220 is identical or substantially close to a thickness of the edge sides of the lid 218 that fit in the grooves 220. In this way, the lid 218 can fit on the molded cavity section 202 with the outer side edge side of the lid 218 being coplanar with the outer edge side of the outer sidewalls 206.

The grooves 220 may be formed according to any of a variety of techniques. Advantageously, because the outer sidewalls 206 can have any desired thickness due to the injection molding technique described herein, the outer sidewalls 206 can be substantially thick enough such that the formation of the grooves 220 is simple and reliable. According to one embodiment, after the molded cavity section 202 of the package is formed, e.g., as described with reference to FIGS. 1-12, an electrically conductive sheet (e.g., copper) is placed over the molded cavity section 202. Subsequently, a cutting process, such as a laser cutting or sawing process is carried out around the perimeter of the package. That is, a small portion of the outer sidewalls 206 is removed along with the adjacent sheet metal. Subsequently, the sheet metal is coated with an electrical insulator that surrounds the sheet metal and fills the grooves 220. Alternatively, the grooves 220 can be molded by an over-mold technique in which the mold material hangs over the sheet metal in a region of the grooves 220.

Referring again to FIG. 14, the lid 218 includes alignment features 222 at one end of the lid 218. The alignment features 222 work in conjunction with the base portion pads 216 disposed on the thicker portion of the mold compound structure as previously discussed with reference to FIG. 13. According to an embodiment, the alignment pads on the lid 218 and the base portion pads 216 are both elongated, i.e., longer in one direction than another. For example, the alignment features 222 and the base portion pads 216 can be oval shaped. Further, the direction of elongation of the base portion pads 216 can be different from the direction of elongation of the alignment features 222 of the lid 218.

Figure 16:
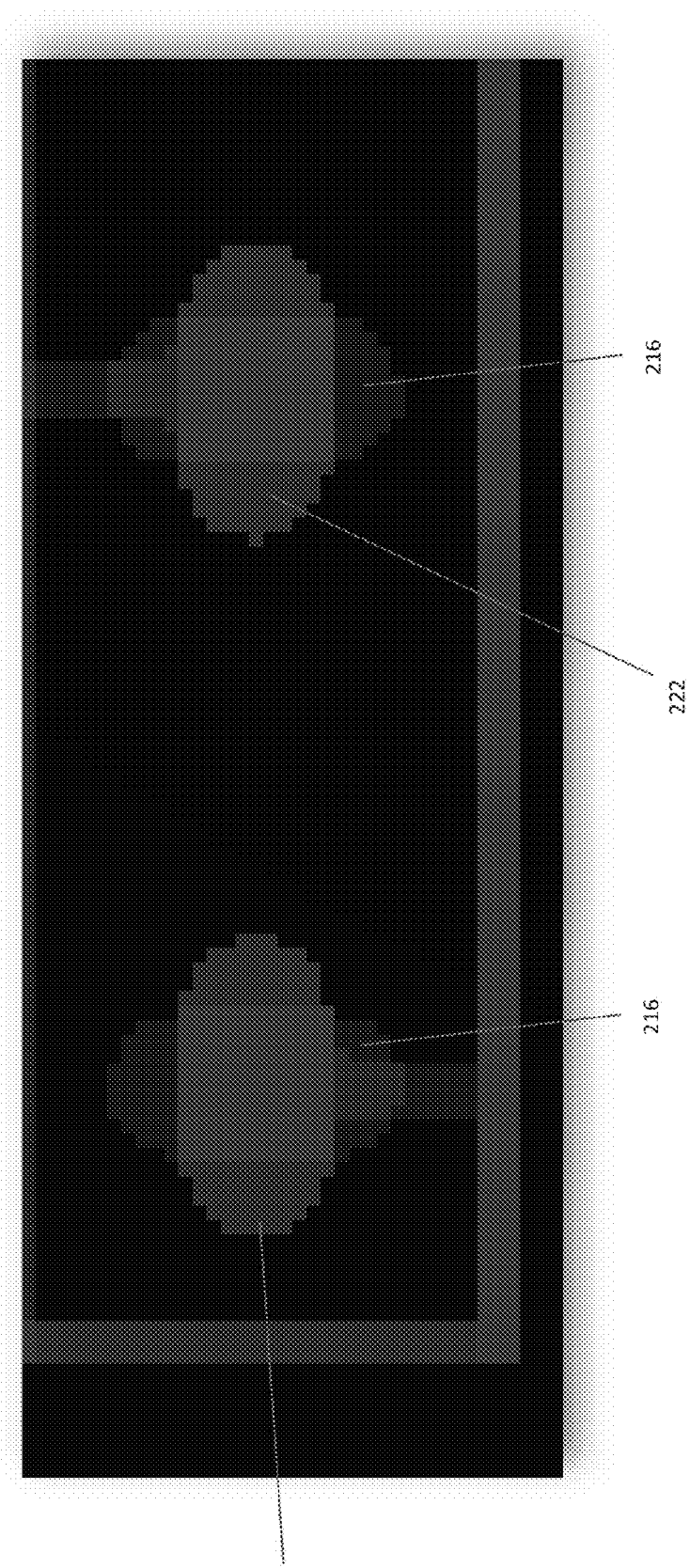
FIG. 16 illustrates a close up view of semiconductor package alignment features, according to an embodiment.

Referring to FIG. 16, a close up view of the alignment features 222 of the lid 218 being aligned with the base portion pads 216 is depicted. In this view, the lid 218 is partially transparent so that the relative position of the alignment features 222 of the 218 and the molded cavity section 202 can be seen. As can be seen, one of the alignment features 222 of the lid 218 aligns with the base portion pads 216. Further, the alignment pads from the lid 218 are elongated in a direction that is perpendicular to the elongation of the base portion pads 216. Accordingly, the lid 218 and the molded cavity section 202 have a built in x-y plane alignment system. This eliminates the need for precise measurement systems for attaching the lid 218, which can be costly. Put another way, a precise measurement of the lid 218 location is no longer necessary. If the alignment pads from the lid 218 cover and are perpendicular to the alignment pads in the molded cavity section 202, as depicted in FIG. 16, the lid 218 is properly positioned. This enables a batch processing technique whereby a plurality of the lids 218 are simultaneously affixed to a plurality of the molded cavity sections 202.

Advantageously, the alignment features 222 and the grooves 220 both individually and collectively enable lid 218 attachment without using costly and time consuming positional measurements. The lid 218 will gravitate to the correct position when placed on the molded cavity section 202 by virtue of the grooves 220. The alignment features 222 provide a reliable and cost effective way to confirm that the lid 218 is in the correct position.

FIGS. 17 and 18 depict two different embodiments of the package 300 with an integrated circuit (i.e., semiconductor chip) mounted therein. The integrated circuits can be any of a variety of devices such as controllers, ASIC devices, sensors, etc. In the embodiments of FIGS. 18 and 19, the package includes a MEMS device 302 and a second integrated circuit 304.

Referring to FIG. 17A, the MEMS device 302 and the second integrated circuit 304 are both affixed to and electrically connected to the lid 218. FIG. 17A shows the lid 218 facing upwards so that the MEMS device 302 and the second integrated circuit 304 are clearly visible. As can be seen, the lid 218 include an open port 306 allows the MEMs device to sense an environmental parameter, e.g., temperature, pressure, etc.

FIG. 17B shows the lid 218 facing downwards in the orientation in which the lid 218 is attached to the package. The lid 218 includes conductive bond pads 306 that are electrically accessible at an outer side. The bond pads 306 may be connected to the alignment features 222 of the lid 218, which in turn may connect to the alignment features 222 of the molded cavity section 202 when the lid 218 is affixed to the molded cavity section 202.

Referring to FIG. 18, the MEMS device 302 and the second integrated circuit 304 are affixed to and mounted within the package cavity (as opposed to the lid 218, as shown in FIG. 17). FIG. 18A shows the package 300 with the lid 218 attached and FIG. 18B shows the package 300 without the lid 218. In this embodiment, the package 300 may include an open port on the bottom side (not shown) so that the MEMS device 302 can sense an environmental parameter, e.g., temperature, pressure, et. In this case, the package includes internal bond pads that can be connected to the MEMS device 302 and/or the second integrated circuit 304, e.g., by bonding wires. The internal bonding pads can be provided on an inner side of the floor 204 section. Alternatively, the package may include an elevated section of the mold compound with a conductive pad disposed thereon.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of forming a semiconductor package, comprising:
   providing a base plate with a first side that comprises an elevated portion, a recessed portion laterally surrounding the elevated portion, and a vertical face extending from the recessed portion to the elevated portion;
   covering at least a part of the vertical face with a metal layer;
   forming a mold compound structure on the first side with the metal layer disposed between the first side and the mold compound structure such that the mold compound structure comprises an elevated portion laterally surrounding a recessed portion, and opposing edge faces that vertically extend from the recessed portion of the mold compound structure to the elevated portion of the mold compound structure; and
   subsequently removing at least a part of the base plate such that the recessed portion of the mold compound structure is uncovered from the base plate and such that the metal layer remains on at least one uncovered section of the mold compound structure.

2. The method of claim 1, wherein covering at least a part of the first side comprises forming the metal layer along the entire vertical face of the base plate, and wherein after at least a part of the base plate is removed, all of the opposing edge faces are covered by the metal layer that was formed on the vertical face of the base plate.

3. The method of claim 2, wherein covering the first side of the base plate comprises covering the elevated portion of the base plate, the recessed portion of the base plate, and the vertical face of the base plate with the metal layer, and wherein after at least a part of the base plate is removed, the elevated portion of the mold compound structure and the opposing edge faces of the mold compound structure are covered by a continuous section of the metal layer.

4. The method of claim 3, further comprising patterning the continuous section of the metal layer.

5. The method of claim 4, wherein patterning the continuous section of the metal layer comprises forming one or more isolated metal pads in the metal layer that covers the elevated portion of the of the mold compound structure.

6. The method of claim 5, wherein the isolated metal pads have an elongated shape.

7. The method of claim 3, wherein forming a mold compound structure comprises:
   forming a first mold compound section that fills the recessed portion of the base plate and covers the elevated portion of the base plate,
   thinning the first mold compound section at a rear face that faces away from the first side of the base plate; and
   forming a second mold compound section at the rear face of the first mold compound section.

8. The method of claim 7, further comprising forming one or more electrically conductive package leads after thinning the first mold compound section and before forming the second mold compound section.

9. The method of claim 8, wherein thinning the first mold compound section comprises planarizing the rear face until the metal layer that covers the elevated portion of the base plate is removed and the elevated portion of the base plate is exposed, wherein forming the one or more electrically conductive package leads comprises forming metal structures on the elevated portion of the base plate is exposed.

10. The method of claim 8, wherein thinning the first mold compound section comprises planarizing the rear face until the metal layer that covers the elevated portion of the base plate is exposed and such that the elevated portion of the base plate remains covered by the metal layer after the planarizing, and wherein forming the one or more electrically conductive package leads comprises masked etching of the metal layer that covers the elevated portion of the base plate.

11. The method of claim 1, wherein providing the base plate comprises:
   providing a metal sheet with a planar outer side; and
   transforming the planar outer side into a non-planar surface thereby forming the elevated portion, the recessed portion and the vertical face of the first side.

12. The method of claim 11, wherein the metal strip comprises stainless steel, and wherein transforming the planar outer side comprises at least one of: stamping, etching, and grinding.

13. The method of claim 1, further comprising forming grooves along an outer perimeter of the elevated portion of the mold compound structure.

14. The method of claim 13, wherein forming the grooves comprises at least one of: laser cutting, sawing or injection molding.

* * * * *

UNITED STATES PATENT AND TRADEMARK OFFICE
CERTIFICATE OF CORRECTION

PATENT NO. : 9,868,632 B2
APPLICATION NO. : 15/079593
DATED : January 16, 2018
INVENTOR(S) : C. Chiang et al.

It is certified that error appears in the above-identified patent and that said Letters Patent is hereby corrected as shown below:

In the Claims

Column 10, Line 65 Claim 5, change "of the of the" to -- of the --.
Column 11, Line 20 Claim 9, change "plate is" to -- plate that is --.

Signed and Sealed this
Third Day of April, 2018

Andrei Iancu
*Director of the United States Patent and Trademark Office*